United States Patent [19]

Tanaka

[11] Patent Number: 5,032,217
[45] Date of Patent: Jul. 16, 1991

[54] SYSTEM FOR TREATING A SURFACE OF A ROTATING WAFER

[75] Inventor: Masato Tanaka, Shiga, Japan

[73] Assignee: Dainippon Screen Mfg. Co., Ltd., Japan

[21] Appl. No.: 393,408

[22] Filed: Aug. 11, 1989

[30] Foreign Application Priority Data

Aug. 12, 1988 [JP] Japan .................................. 63-202372

[51] Int. Cl.⁵ ......................................... H01L 21/306
[52] U.S. Cl. .................... 156/640; 134/153; 134/902; 134/25.4; 156/626; 156/345
[58] Field of Search ........................ 156/345, 626, 640; 239/86; 356/357; 134/153, 254, 33, 34, 18, 902

[56] References Cited

U.S. PATENT DOCUMENTS

| | | | |
|---|---|---|---|
| 3,953,265 | 4/1976 | Hood | 156/626 |
| 4,021,278 | 5/1977 | Hood et al. | 156/626 |
| 4,161,356 | 7/1979 | Giffin et al. | 134/153 |
| 4,178,188 | 12/1979 | Dussault et al. | 134/33 |
| 4,317,698 | 3/1982 | Christol et al. | 156/345 |
| 4,521,255 | 6/1985 | Raymor et al. | 134/33 |
| 4,569,717 | 2/1986 | Ohgami et al. | 156/626 |
| 4,767,495 | 8/1988 | Nishioka | 156/626 |
| 4,788,994 | 12/1988 | Shinbara | 134/902 |
| 4,871,417 | 10/1989 | Nishizawa et al. | 156/640 |

FOREIGN PATENT DOCUMENTS

| | | |
|---|---|---|
| 55-115332 | 9/1980 | Japan . |
| 61-108326 | 5/1986 | Japan . |
| 61-121442 | 6/1986 | Japan . |
| 144332 | 6/1987 | Japan . |
| 62-264626 | 11/1987 | Japan . |
| 63-147327 | 6/1988 | Japan . |

*Primary Examiner*—Richard V. Fisher
*Assistant Examiner*—John J. Bruckner
*Attorney, Agent, or Firm*—Ostrolenk, Faber, Gerb & Soffen

[57] ABSTRACT

An apparatus and method for treating a surface of a wafer by using a treatment solution includes a wafer rotating device for rotating the wafer in a horizontal plane, and a treatment solution discharge nozzle for continuously discharging the treatment solution at an angle of greater than zero and less than 45 degrees relative to the surface of the rotating wafer. The treatment solution discharged from the treatment solution discharge nozzle impinges upon the surface of the wafer at the point nearer to the edge than to the center and then forms a stable layer of solution on the entire surface of the wafer by making use of its speed and its centrifugal force. Since the layer of the treatment solution has an even thickness over the whole surface of the wafer, the surface of the wafer is treated uniformly. Furthermore, it is easy to optically detect an end of treatment.

10 Claims, 6 Drawing Sheets

SYSTEM FOR TREATING A SURFACE OF A ROTATING WAFER

BACKGROUND OF THE INVENTION

1. Field of the Invention

The present invention relates to a method and an apparatus for treating a surface of a rotating thin plate (hereinafter referred to as wafer) by supplying a surface treatment solution (such as an etchant or a developing solution) thereto. The wafer may be a semiconductor wafer, a glass wafer for a photomask or a glass wafer for a liquid crystal display device.

2. Background of the Prior Art

In recent years, photoetching technology has become very important. For instance, in semiconductor industries, a microscopic circuit pattern cannot be formed on a silicon wafer without using photoetching technology.

In general, photoetching is effected as follows: A photoresist layer is formed on a layer to be etched for the purpose of protecting the layer to be etched from an etchant. A pattern (which is also formed on a photomask by photoetching) is optically printed on the photoresist layer. The photoresist layer is developed, whereby the pattern on the photomask is transferred onto the photoresist layer. When the etchant is supplied from above the photoresist layer, portions of the layer to be treated (i.e., portions not protected by the photomask) are etched. After the layer to be treated is sufficiently etched, the remaining photoresist layer is removed. Thus, the same pattern as that on the photomask is formed on the layer to be treated.

As is evident from the above-mentioned brief description of the photoetching process, it is necessary to treat the surface of the wafer on various occasions. For these purposes, it is necessary to supply an etchant, a developing solution or the like to the surface of the wafer. The present invention is directed particularly to an improved technique for treating a surface of a wafer while rotating the wafer.

FIG. 1 is a block diagram of a conventional apparatus for such surface treatment. The conventional apparatus includes a spin chuck 22 for holding a central portion of a light transmitting wafer 21 by suction and for rotating the wafer 21 around its center. A full cone nozzle 23 is provided above the wafer 21. The nozzle 23 sprays a treatment solution in a conical pattern onto the upper surface of the wafer 21. A projection fiber 26 is provided under the wafer 21; opposite to the lower surface of the wafer 21. The fiber 26 projects light onto the lower surface of the wafer 21. The conventional apparatus further includes a light emitting device 25 for applying light to the projection fiber 26. A light receiving fiber 27 is provided above the wafer 21, opposite to the projection fiber 26. The fiber 27 receives light projected from the projection fiber 26. The conventional apparatus further includes a light receiving device 28 for receiving light from the light receiving fiber 27 and for outputting a photoelectric signal by photoelectric conversion. The conventional apparatus further includes a treatment end detecting portion 29 for detecting an end point of surface treatment in response to the photocurrent from the light receiving device 28.

Operation of the conventional apparatus is disclosed in Japanese Patent Laying-Open No. 62-144332, entitled "Aluminum Spin Spray Etching Apparatus".

The conventional apparatus operates in the following manner. The spin chuck 22 maintains the wafer 21 in a horizontal position by supporting the center of the lower surface of the wafer 21 by a suction mechanism (not shown). A layer 30 to be treated is formed in advance on the upper surface of the wafer 21. The layer 30 includes, for example, a metal layer (not shown) to be etched, and an etching resist mask (not shown) formed on the metal layer with a desired pattern.

A drive means (not shown) rotates the spin chuck 22 at a predetermined angular speed such that the wafer 21 rotates around its center. The nozzle 23 sprays a treatment solution (e.g., an etchant) onto the upper surface of the wafer 21. The nozzle 23 sprays the treatment solution in a conical pattern. The portion of the metal layer which is not protected by the mask is etched by the etchant.

Light generated by the light emitting device 25 is projected onto the lower surface of the wafer 21 through the projection fiber 26. The light receiving fiber 27 is opposed to the projection fiber 26. The wafer 21 is located therebetween. Light projected from the projection fiber 26 is transmitted through the wafer 21 and the layer 30 to be treated and reaches the light receiving fiber 27. At this point, a first component of light from the fiber 26 reaches the fiber 27. The remaining component is reflected downward by the upper surface of the metal layer, is further reflected upward by the upper surface of the wafer 21 and then reaches the light receiving fiber 27.

The difference between the optical paths of the two components is equal to twice the thickness of the metal layer. Since the components follow different optical paths, the components interfere with each other. The metal layer of the layer 30 to be treated is decreased by etching. Thus, the difference between the optical paths become smaller as etching proceeds. The point in time when the portion of the metal layer which is not protected by the mask is completely etched is called the etching end point. The etching end point is defined as the point in time when the intensity of the light which is transmitted through the wafer 21 does not change due to interference between its components.

The light receiving device 28 converts light received by the light receiving fiber 27 to a photoelectric signal. The treatment end detecting portion 29 monitors changes in the photocurrent and when the changes in the photocurrent become smaller than a predetermined value and stable, a determination is made to discontinue etching. Such automatic detection of the etching end point enhances repeatability and improves precision.

The treatment solution is sprayed in a conical pattern onto the surface of the wafer by the full cone nozzle because this is believed to provide the most uniform treatment. However, actually, the sprayed treatment solution is applied in the form of a large number of particles, which collide with the surface of the wafer. As a result of such collision, a small unevenness or a rugged pattern might be formed on the surface of the wafer. Such unevenness might adversely affect the treatment of the surface of the wafer. For instance, an oxide film formed on the rough surface is liable to be electrically broken.

In addition, in the conventional apparatus, detection of the end point of treatment is often inaccurate. One of the causes of such inaccuracy is an unstable state of the optical paths. This instability can be caused by vibrations in the treatment solution layer due to non-uniformity of the treatment solution on the wafer surface. The non-uniformity can be caused by spraying the treatment solution.

Another cause of inaccuracy is centrifugal diffusion of the treatment solution due to the rotation of the wafer. Such diffusion causes non-uniformity of the treatment solution. The non-uniformity of the treatment solution causes the amount of light reaching the fiber 27 to vary widely. This creates noise which makes it difficult to detect the end point of treatment with accuracy. In other words, the amount of photoelectric signal inputted to the detecting portion 29 varies by factors other than light interference.

It is particularly difficult to accurately detect the end point of treatment when etching contact holes having a very small diameter. Normally, an opening ratio of the contact holes (the ratio between the area of the surface of the wafer and the total area of all the contact holes formed in the wafer) is less than 5%. Because of this small opening ratio, there is little change in the intensity of light as etching proceeds. Furthermore, treatment solution crosses the light path with irregularity and, as a result, an irregular change occurs in the intensity of light reaching the light receiving fiber 27. These unfavorable conditions make it difficult to accurately detect the end point of treatment.

SUMMARY OF THE INVENTION

Therefore, an object of the present invention is to provide an apparatus and a method for treating a surface of a rotating wafer, by which the above-described problems can be solved.

The present invention relates to a method of treating the surface of a wafer, the method including the steps of: rotating a wafer; and while rotating the wafer, treating the wafer by discharging a continuous stream of treatment solution from a nozzle onto an upper, substantially horizontal surface of the wafer, the continuous stream impinging upon the surface of the wafer at a location which is nearer to a peripheral edge of the surface than to the center of the surface; wherein (a) the angular velocity of the wafer, (b) the angle between the continuous stream and the substantially horizontal surface of the wafer, (c) the pressure at which the treatment solution is discharged from the nozzle, and (d) the distance between the peripheral edge and the location at which the continuous stream impinges upon the surface are such that a stable layer of treatment solution is formed on the surface of the wafer with treatment solution reaching the center of the surface of the wafer against centrifugal force generated by the rotation of the wafer.

The foregoing and other objects, features, aspects and advantages of the present invention will become more apparent from the following detailed description of the present invention when take in conjunction with the accompanying drawings.

DETAILED DESCRIPTION OF THE PREFERRED EMBODIMENTS

Figure 1:
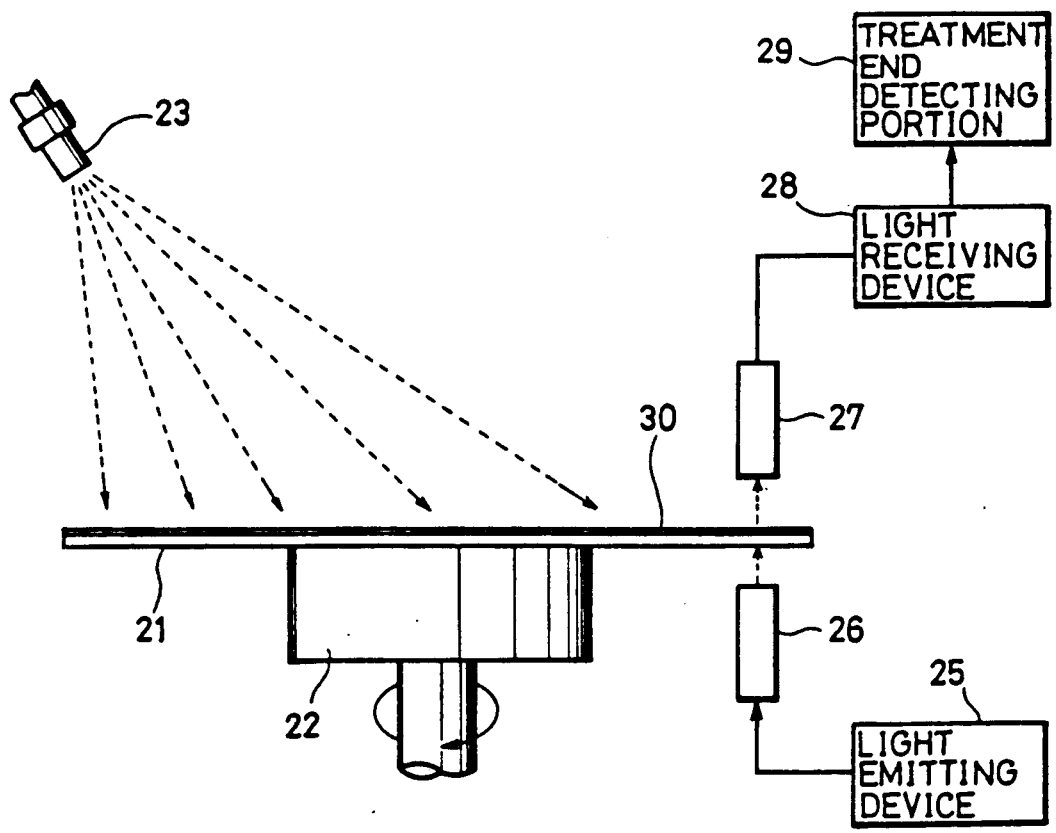
FIG. 1 is a block diagram of a conventional apparatus.
Figure 2:
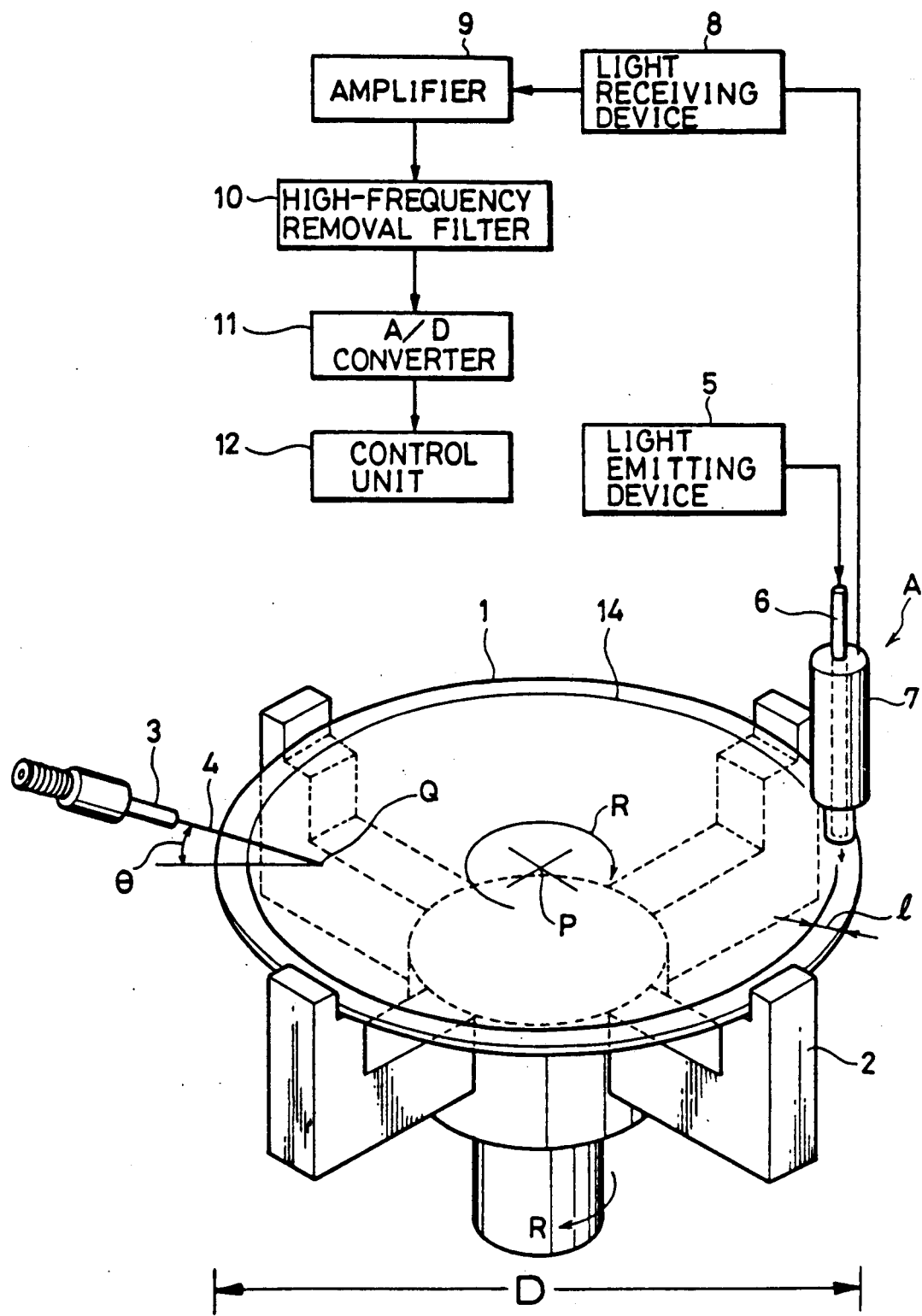
FIG. 2 is a block diagram of an apparatus according to the present invention.
Figure 3:
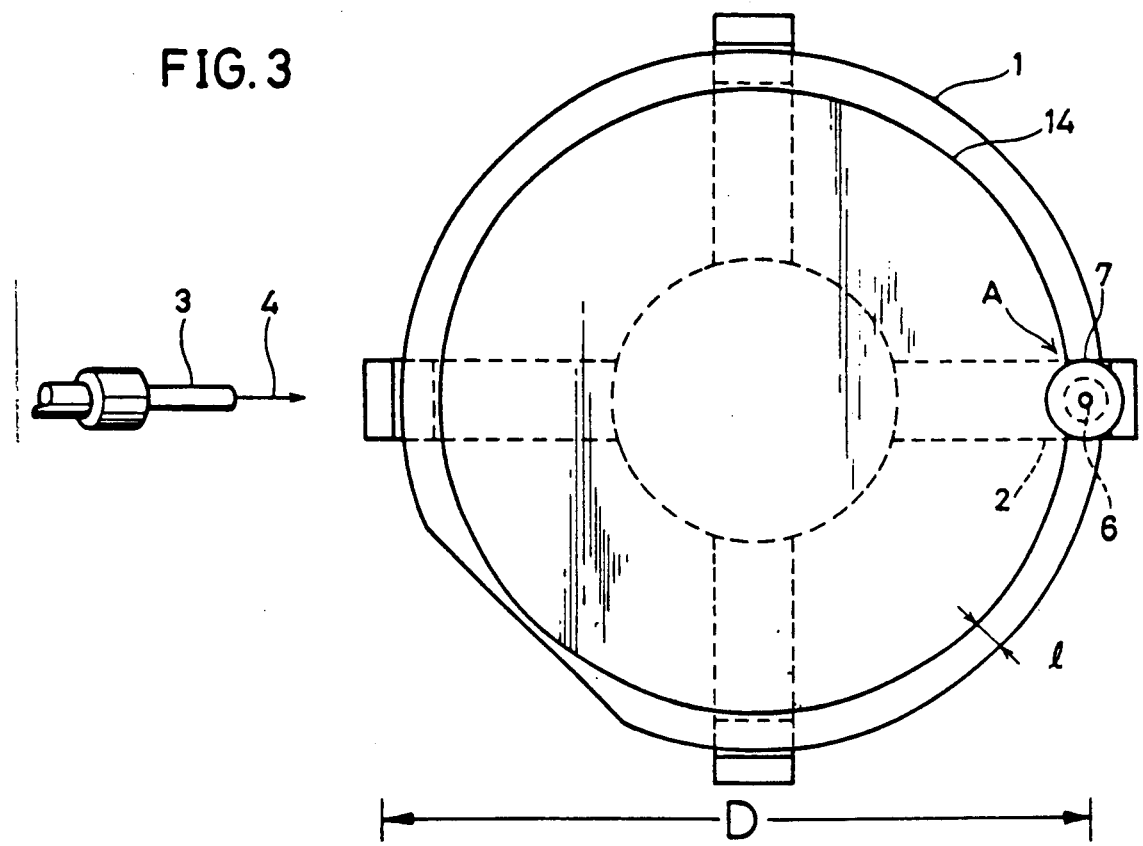
FIG. 3 is a plan view of a wafer and a spin chuck for holding and rotating the wafer.
Figure 4:
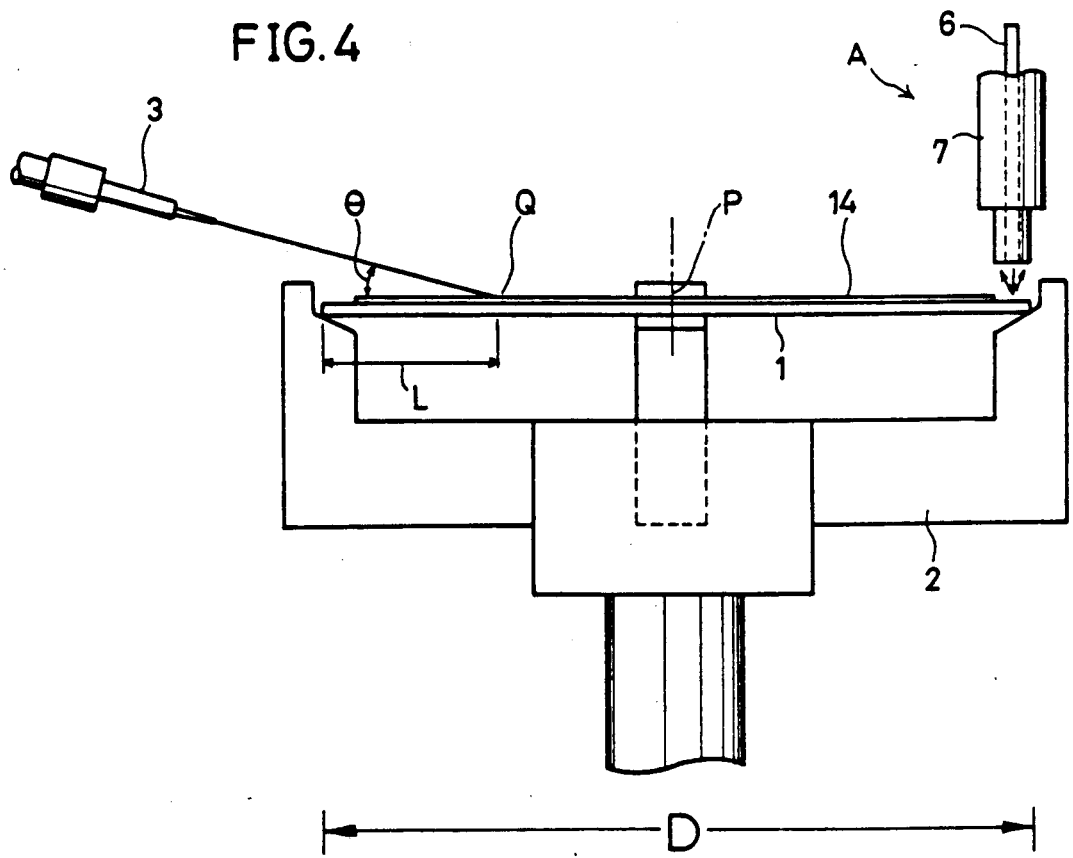
FIG. 4 is a side view of the spin chuck.
Figure 5:
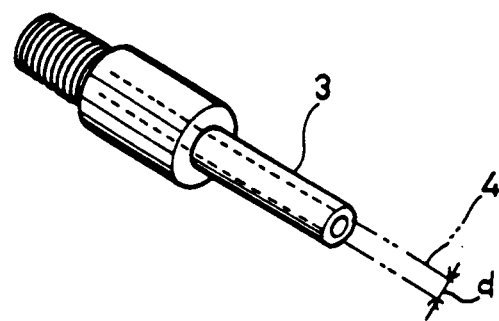
FIG. 5 is a perspective view of a capillary nozzle.
Figure 6:
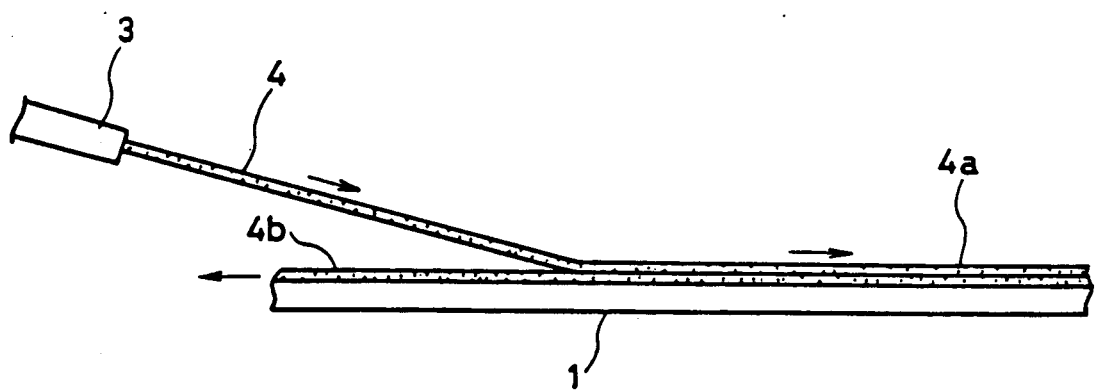
FIG. 6 is a schematic view of treatment solution flowing onto a surface of a wafer.

An apparatus for treating a surface of a wafer according to the present invention is shown in FIGS. 2 to 5. This apparatus includes a spin chuck 2 for holding the wafer 1 in a horizontal position and for rotating the wafer 1 around its center P at a predetermined angular speed. A capillary nozzle 3 is located above the spin chuck 2. A straight continuous flow of treatment solution shoots out of the nozzle 3 and reaches the surface of the wafer 1. A device A for optically detecting an end point of treatment is located near a peripheral portion of the wafer 1. A light emitting device 5 is used as a light source of the device A and a light receiving device 8 receives light from the device A and converts it to electric current. An amplifier 9 amplifies the output from the light receiving device 8 and a filter 10 removes high frequency noise components from the output from the amplifier 9. The apparatus further includes an A/D (analog-to-digital) converter 11 for A/D conversion of the output from the filter 10; and a control unit 12 for controlling the surface treatment of the wafer 1 based on the output from the A/D converter 11.

A silicon oxide film (not shown) is formed on the surface of the wafer 1 and is covered with a resist film 14 having a desired pattern (not shown). A peripheral portion corresponding to a predetermined length l (for example, about 5 mm) from an outer edge of the surface of the wafer 1 is removed in advance. This removal is described in detail later.

The device A is located above and slightly inside of the outer edge of the wafer 1. Light is emitted from the device A and enters the peripheral portion of the wafer 1. The device A includes a projection fiber 6 for projecting light from the light emitting device 5 onto the upper surface of the wafer 1. The device A also includes a light receiving fiber 7 for collecting and guiding light reflected by the surface of the wafer 1 to the light receiving device 8. The fiber 7 surrounds the fiber 6.

Let us consider an imaginary plane which includes the center P of the wafer 1 and the nozzle 3 and which is perpendicular to the surface of the wafer 1. A straight line drawn by the flow of treatment solution 4 from the nozzle 3 is included in this plane. This straight line has an angle of elevation $\theta$ ($\theta < 90°$) and intersects the surface of the wafer 1 at a point Q. The point Q is between the center P and the nozzle 3. The point Q is at a distance L from the outer edge of the wafer 1. The angle $\theta$ is preferably between 0° and 45°. Preferably, the angle $\theta$ is as small as possible insofar as the spin chuck 2 does not interfere with the flow of the treatment solution. In this embodiment, $\theta$ is 20°. If the angle $\theta$ is large, there would be a particularly large etching rate near the point Q, causing a little deterioration in the uniformity of the treatment.

Referring to FIGS. 2 to 6, operation of this apparatus will be described. The silicon oxide film (not shown) is formed on the surface of the wafer 1 and the resist film 14 is formed thereon. A desired pattern (not shown) is formed in advance in the resist film 14 and the resist on the portion to be etched is removed.

The spin chuck 2 holds the wafer 1 horizontally with the surface having the resist film 14 being directed upward. The spin chuck 2 rotates the wafer 1 at an angular velocity r in revolutions per minute (rpm) in the direction shown by the arrow R in FIG. 2. The nozzle 3 discharges the treatment solution 4 in a straight line with shooting pressure p. The discharged treatment solution 4 contacts the surface of the wafer 1 at the point Q. The inertia of the solution 4 and pressure exerted by subsequent treatment solution causes the treatment solution 4 to flow toward the center P. The solution 4 forms a centripetal fluid layer 4a, particularly when the angular velocity r of the spin chuck 2 is small.

Friction between the centripetal fluid layer 4a and the wafer 1 causes the centripetal fluid layer 4a to rotate together with the wafer 1. The pressure of the succeeding treatment solution is soon not applied and the movement in the centripetal direction due to inertia becomes small because of friction caused by contact with the wafer 1. Further, centrifugal force is applied to the treatment solution as it rotates around the center P. As a result, the treatment solution on the wafer 1 is caused to flow in a direction away from the center P, to form a centrifugal fluid layer 4b.

The treatment solution 4 is constantly supplied from the nozzle 3. The supplied treatment solution 4 forms the centripetal fluid layer 4a. The centripetal fluid layer 4a moves toward the center P and then it moves in the centrifugal direction and becomes the centrifugal fluid layer 4b. The fluid layer 4b moves to the periphery of the wafer 1 and is dispersed around the wafer 1.

The quantity of treatment solution supplied from the nozzle 3 balances the quantity of treatment solution dispersed from the periphery of the wafer 1. Thus, the centripetal fluid layer 4a and the centrifugal fluid layer 4b are dynamically stable. Since the wafer 1 rotates, a virtually even layer of treatment solution is constantly formed on the surface of the wafer 1. This layer includes the layers 4a, 4b and a mixture thereof. Accordingly, etching of the silicon oxide film (not shown) is effected in a substantially uniform manner over the whole area of the surface of the wafer 1. An end point of treatment is detected by the device A.

The above-described operation can be controlled by various parameters, including the angle of elevation $\theta$, the length L, the angular velocity r, the shooting pressure p, the diameter D, the diameter d, the substance to be treated, the treatment solution, the temperature T and so on.

Experiment 1

The parameters were set as indicated below and a silicon oxide film was etched. In this experiment, to observe etching conditions on the whole surface of the wafer 1, a resist film was not formed on the silicon oxide film.

$\theta = 20°$
L = 15 mm
p = 1.0 kg/cm$^2$
T = 23° C.
D = 6 inches
d = 4 mm

The treatment solution was a mixture of 50% hydrofluoric acid and 40% ammonium fluoride in the ratio 1:6. Treatment was effected under these conditions for about 60 seconds by the above-described apparatus. The silicon oxide film was etched uniformly over the whole surface of the wafer 1.

Experiment 2 p = 0.5 kg/cm$^2$
L = 37.5 mm

The other conditions were the same as those in the first experiment. In this experiment, the silicon oxide film was also etched uniformly.

Experiment 3

This experiment used the same conditions as those in the first experiment, except that p was equal to 0.5 kg/cm$^2$. In this case, etching in the central portion of the wafer 1 was small compared with that in the peripheral portion. This is because the shooting pressure p of the treatment solution was small compared to the centrifugal force. In such case, only a small amount of treatment solution reached the center P. The rotating speed of the wafer 1 clearly is an important factor in determining the amount and pressure of treatment solution which shoots from the nozzle 3.

Experiment 4 p = 0.5 kg/cm$^2$
L = 75 mm

The other conditions were all the same as in experiment 1. With L being equal to 75 mm, the position where the treatment solution is supplied is the center of the wafer (having a diameter of 6 inches $\approx$ 15 cm). In this experiment, treatment in portions of the wafer 1 other than the center P was effected uniformly. However, the etching rate near the center P was high. The portion around the center P was deeply etched. As a result, a circular depression was formed.

Experiments with different angles $\theta$ were also conducted. The larger the angle $\theta$, the higher the etching rate near the point Q, and a ring-shaped depression was formed on the surface of the wafer. The smaller the angle $\theta$, the smaller the deeply etched area. It was confirmed that if the conditions were suitably set as in the experiments 1 and 3, the above-described disadvantages were overcome.

Experiment 5

Experiments were conducted by changing the angular velocity r to various values with other conditions being fixed. The results of these experiments are as follows:

a) The greater the angular velocity, the more uniform the etching treatment.

b) The etching rate increases as the angular velocity increases. It is known that when using a conventional conical nozzle, the etching rate decreases as the angular velocity increase.

c) The surface of the wafer 1 after etching is constantly smooth independent of the rotating speed of the wafer 1. When using a conventional conical nozzle, the finished surface of the wafer 1 becomes rougher as the rotating speed is increased.

In the above-described experiment, it was confirmed that there was little amount of dispersed treatment solution. As a result, loss of the solution and adverse environmental effects were reduced. In consequence, the following conclusions are obtained.

1) The smaller the angle $\theta$, the more uniform the surface of the treated wafer. This is because, when the angle $\theta$ is small, the pressure applied to the upper surface by the treatment solution is small and the treatment solution can easily reach the center P.

2) The smaller the distance L, the more satisfactorily the treatment is effected. This is confirmed by the experiments. It should be noted that it is necessary to increase the shooting pressure p of the treatment solution since the point Q becomes distant from the center P as the distance L is decreased. If the pressure p is not increased, an insufficient amount of treatment solution reaches the center P.

3) If the angular velocity r of the wafer 1 is large, treatment is uniform and the etching rate is increased. However, if the number r is large, it is also necessary to increase the shooting pressure p. Dispersion of treatment solution to the environment is also increased.

In the above-described embodiment, the opening of the nozzle 3 has a circular cross section. The opening may, however, be in the form of a slot which is parallel to the surface of the wafer. In this case, the treatment solution is discharged from the slot as a flat continuous flow.

As is clearly understood from the previously described embodiment, the present invention provides various advantages. A great advantage not yet described is that an end point of surface treatment can be detected accurately. This is because the treatment solution on the upper surface of the wafer 1 forms a stable layer.

Figure 7:
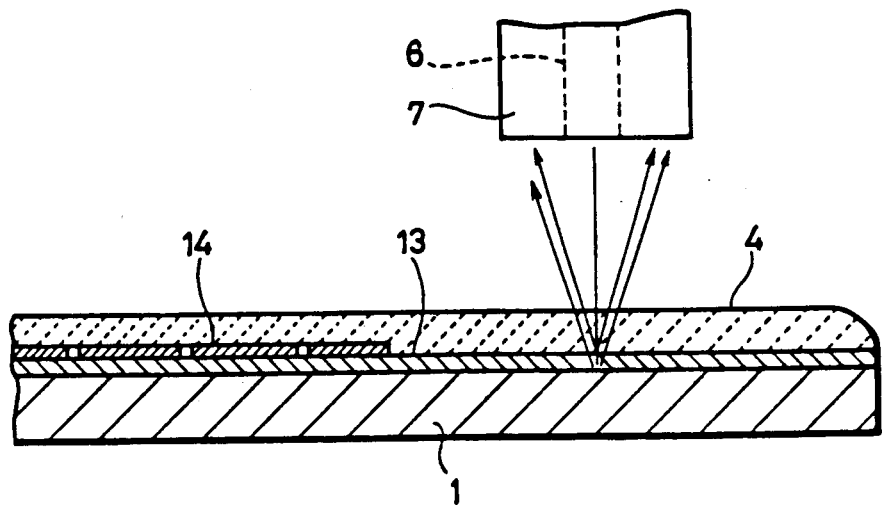
FIG. 7 is a schematic sectional view of a peripheral portion of a wafer.

Referring to FIG. 7, a silicon oxide film 13 to be etched is formed on the surface of the wafer 1 and a resist film 14 (to which a predetermined pattern is transferred) is formed thereon. The resist layer 14 is not formed in the peripheral portion of the wafer 1. If the resist layer 14 is formed in the peripheral portion, the number of particles adhering to the surface of the wafer 1 in a coating aftertreatment is increased excessively. The width l of the peripheral portion is normally about 5 mm. The silicon oxide film 13 is exposed in the peripheral portion of the wafer 1. During treatment, a layer of the treatment solution 4 covers the surface of the wafer 1. The projection fiber 6 and the light receiving fiber 7 are located opposite to the peripheral portion.

In operation, the projection fiber 6 applies light toward the surface of the wafer 1. A first component of the light is reflected on the surface of the silicon oxide film 13 and returns to the light receiving fiber 7. A second component of light is transmitted through the silicon oxide film 13 and reaches the surface of the wafer 1, where it is reflected and returned to the light receiving fiber 7.

Accordingly, the lengths of the optical paths of the two reflected components are different such that the components interfere with each other and the difference is a function of the thickness of the silicon oxide film 4. As etching proceeds, the thickness of the silicon oxide film 13 decreases and the difference between the optical paths decrease, causing a change in interference, causing a change in the intensity of light received by the fiber 7.

The light which reaches the light receiving fiber 7 is introduced into the light receiving device 8 through a receive end of the light receiving fiber 7. The light receiving device 8 performs photoelectric conversion in response to the inputted light. The electric signal outputted from the light receiving device 8 is amplified by the amplifier 9. The amplified signal includes noise, caused not only by the change in the output due to the interference of the received light but also by irregularities in the surface of the treatment solution or the etching rate, noise caused by changes in the spacing between the surface of the wafer 1 and the device A or the like. The noise has, in general, a cycle which is shorter than a cycle of change in the output due to the interference of the received light. The high frequency removal filter 10 serves to remove such high frequency noise.

A signal from the high frequency removal filter 10 is digitized by the A/D converter 11. The control unit 12 monitors the digitized signal and determines an end point of treatment when the change in the signal satisfies a predetermined condition. After the end point of treatment is detected, the control unit 12 effects additional etching for a predetermined period to remove the residue of treated film. As described previously, the detection of the end point of treatment is an indispensable technique for effecting treatment with good repeatability.

The treatment effected by the control portion 12 will be described in the following: The following control operation is performed by a microcomputer for example (not shown) which executes a predetermined control program. An input signal is sampled for a predetermined time (e.g., for 0.01 second) in the control unit. To remove the noise contained in the input signal, sampled values are added for a predetermined period and the value obtained by the addition is divided by the number of samplings so that an average value is obtained.

For instance, to obtain end point data for detection of an end point, a plurality of average values are obtained at intervals of a predetermined period. The absolute value of the difference of the consecutive two average values is obtained. The values thus obtained are added for a predetermined period so that end point data representing the changes of the output of the light receiving device 8 is obtained. The end point data represents the amount of change for the predetermined time of output of the light receiving device 8.

As etching proceeds, the thickness of the treated film decreases according to the etching rate. The difference between the optical paths of the reflected components also decreases. Accordingly, the output of the light receiving device 8 changes considerably due to the interference of light during etching. When the etching reaches the end point, there is no optical path difference and accordingly the output of the light receiving device 8 does not change. According to the program, a point where the end point data becomes smaller than a predetermined value is defined as the end point of treatment.

Figure 8:
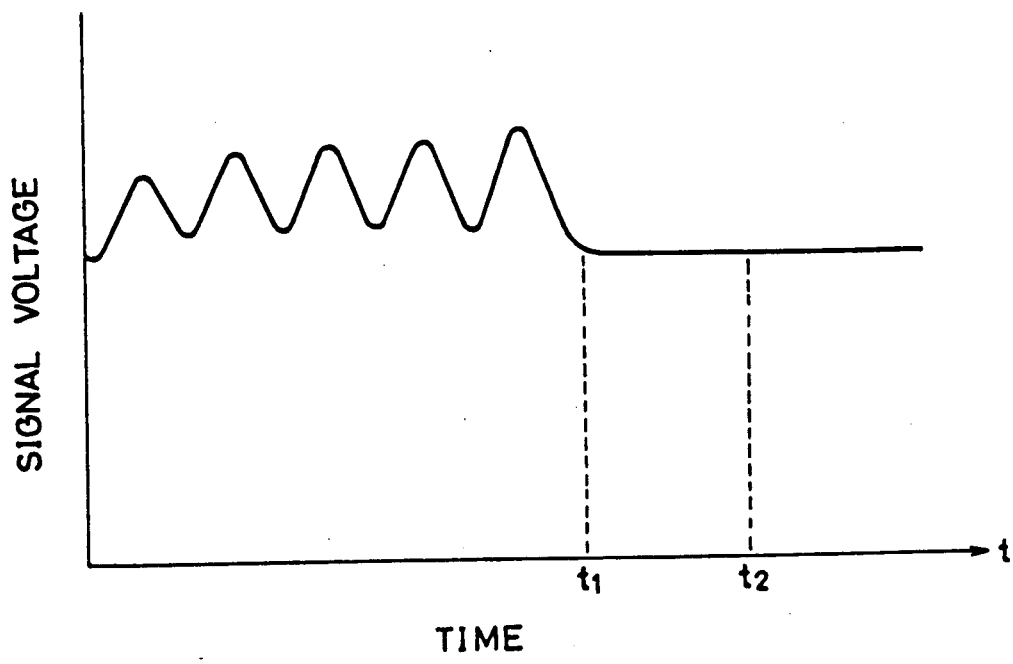
FIG. 8 is a graph showing changes in a signal due to optical interference.

Referring to FIG. 8, a signal voltage which fluctuates considerably due to the interference of light for a while after a start of treatment does not change at the time t=t1 and thereafter. In the control unit 12, this point is determined to be the end point of treatment. The control unit 12 effects additional etching from t=t1 to t=t2 and then stops the supply of treatment solution.

Figure 9:
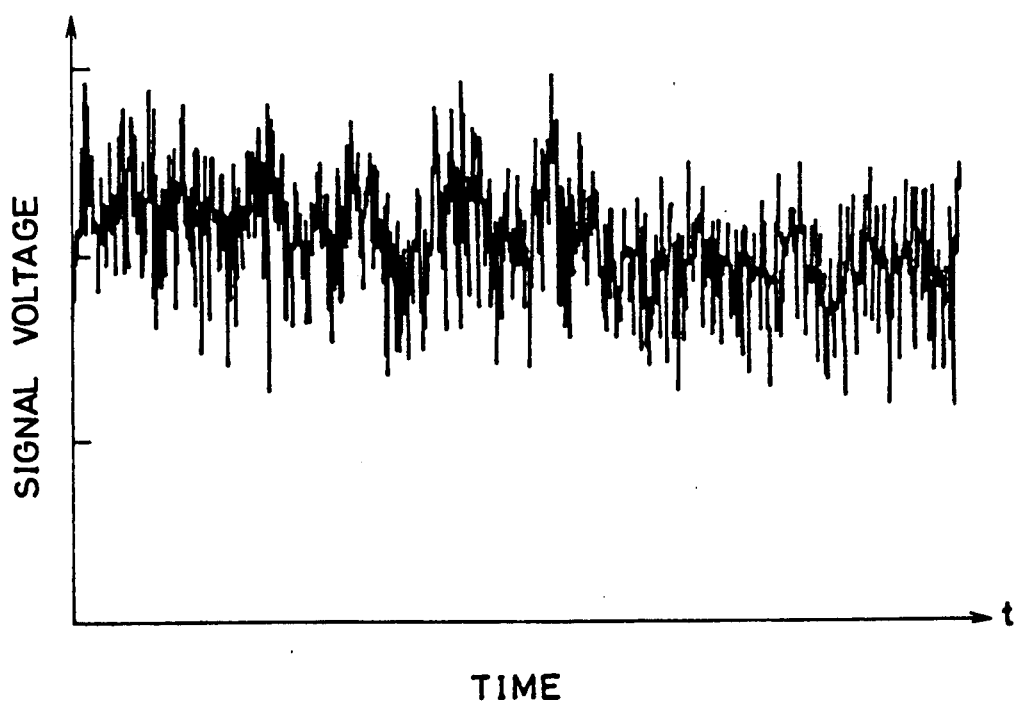
FIG. 9 is a graph showing changes in a signal obtained by a conventional apparatus.

If the conical nozzle 23 (FIG. 1) of the prior art is used, the surface has an irregular state due to vibration of the treatment solution on the surface of the wafer, movement of the treatment solution caused by centrifugal force, and so on. This is because the treatment solution supplied to the surface of the wafer is formed of a large number of particles. As a result, if an end point of treatment is to be detected in a conventional apparatus under the same conditions as those in the preferred embodiment, the signal obtained contains an excessive amount of noise. According to the experiment, as shown in FIG. 9, a signal containing a large amount of noise was obtained in the conventional apparatus. It is substantially impossible to detect the end point of treatment accurately from the waveform shown in FIG. 9.

FIG. 8 shows a waveform of the signal for treatment end point detection obtained according to the present invention. This waveform is a fine interference waveform containing little noise. As evident from a comparison between FIGS. 8 and 9, the use of the capillary nozzle 3 makes it possible to treat the surface of the wafer much more accurately than is possible with the conventional apparatus. Further, according to the present invention, detection of the end point of treatment can be very easily automated.

The projection fiber 6 and the light receiving fiber 7 are positioned above the peripheral portion because it is difficult to determine the progress of etching by beams reflected from the resist layer 14. In the experiment, a signal obtained by placing the projection fiber 6 and the light receiving fiber 7 in the portion having the resist layer 14 did not exhibit an interference waveform as shown in FIG. 8 and accordingly it was not possible to determine the progress of treatment. Another reason for positioning the fibers 6 and 7 above the peripheral portion, i e., where the resist layer 14 is removed, is that if very small diameter holes (such as contact holes) are formed in the silicon oxide film 13, there is little change in the intensity of received light when the device A is located above the resist layer 14. As described previously, this is because the contact holes have a small opening ratio and an absolute quantity of light transmitted to the surface of the wafer is small. A further reason is that if contact holes are formed in the silicon oxide film 13, reflected light is scattered due to the thicknesses of the resist layer 14 and the silicon oxide film 13. Therefore, a correct light interference waveform could not be obtained.

According to the present invention, disturbances caused by the treatment solution are considerably reduced and all the above described problems are solved. Consequently, it is very easy to detect the end point of treatment.

It is to be added that an orientation flat is often provided in a peripheral portion of a semiconductor wafer. The orientation flat is used to indicate a crystallographic reference direction in the wafer surface for the purpose of registration of the wafer. The existence of the orientation flat causes the light receiving fiber 7 to provide an intermittent output. However, since the rotating speed of the wafer is high, the intermittence of the signal caused by the existence of the orientation flat can be regarded as a noise and removed by a filter.

In the above-described embodiment, the wafer has a diameter of 6 inches (about 15 cm). However, the size of the wafer may be changed. In addition, the size of the peripheral portion is variable. Different manufacturers make different sized peripheral portions. Accordingly, the position of the device A is desirably movable in the radial direction of the wafer 1.

The present invention is not limited to the above-described embodiment. For example, the present invention may be used with a detecting device which transmits from the lower surface to the upper surface of a wafer. In such a case, the transmitted light is detected in a peripheral portion of the wafer. This makes it possible to ensure a sufficient change of intensity of the transmitted light. Consequently, the precision of treatment and detection can be enhanced Although the present invention has been described and illustrated in detail, it is clearly understood that the same is by way of illustration and example only and is not to be taken by way of limitation. The spirit and the scope of the present invention should be limited only by the terms of the appended claims.

What is claimed is:

1. A system for treating the surface of a wafer, the system comprising:
   rotating means for rotating a wafer; and
   treating means for treating the wafer while rotating the wafer, the treating means including a nozzle for discharging a continuous stream of treatment solution onto an upper, substantially horizontal surface of the wafer, the treating means being arranged such that the continuous stream impinges upon the upper surface of the wafer at a location which is nearer to a peripheral edge of the surface than to the center of the surface, the nozzle being arranged such that the angle between the continuous stream and the surface of the wafer is greater than 0 and less than or equal to 45°;
   wherein the rotating means and the treating means are arranged such that a layer of treatment solution which has substantially no irregularities is formed on the surface of the wafer with treatment solution reaching the center of the surface of the wafer against centrifugal force generated by the rotation of the wafer.

2. The system of claim 1, wherein the nozzle is arranged such that the angle between the continuous stream and the surface of the wafer is less than or equal to 20°.

3. The system of claim 1, wherein the nozzle has a circular opening.

4. The system of claim 1, wherein the nozzle has a slot shaped opening for discharging a flat continuous stream of treatment solution.

5. The system of claim 1, further comprising control means which includes detecting means for detecting an end point of the treatment of the wafer and means for discontinuing the discharge of treatment solution in response to the detection of the end point.

6. The system of claim 5, wherein the detecting means includes means for projecting coherent light onto a substantially ring-shaped region of the surface so as to reflect a first component of the coherent light from the top of the surface and so as to reflect a second component of the light from the bottom of the surface, means for receiving the components, and means for outputting a detection signal when interference between the components becomes smaller than a predetermined value.

7. The system of claim 5, wherein the detecting means includes means for transmitting coherent light through a substantially ring-shaped region of the surface such that two components of the light travel through the region along different paths, means for receiving the components, and means for outputting a detection signal when interference between the components becomes smaller than a predetermined value.

8. A system for treating the surface of a wafer, the system comprising:
   a wafer;
   rotating means for rotating the wafer; and
   treating means for treating the wafer while rotating the wafer, the treating means including a nozzle for discharging a continuous stream of treatment solution onto an upper, substantially horizontal surface of the wafer, the treating means being arranged such that the continuous stream impinges upon the upper surface of the wafer at a location which is nearer to a peripheral edge of the surface than to the center of the surface, the nozzle being arranged such that the angle between the continuous stream and the surface of the wafer is greater than 0 and less than or equal to 45°;

wherein the rotating means and the treating means are arranged such that a layer of treatment solution which has substantially no irregularities is formed on the surface of the wafer with treatment solution reaching the center of the surface of the wafer against centrifugal force generated by the rotation of the wafer.

9. The system of claim 8, wherein the peripheral edge of the surface of the wafer is substantially circular.

10. The system of claim 9, wherein the surface of the wafer includes a layer to be etched and a photoresist layer, the photoresist layer being formed on the layer to be etched except for a peripheral portion adjacent to the peripheral edge;

the system further comprising detecting means for detecting the end point of the treatment of the wafer, the detecting means being positioned opposite to and above the peripheral portion.

* * * * *